(12) United States Patent
Goto

(10) Patent No.: US 10,497,547 B2
(45) Date of Patent: Dec. 3, 2019

(54) TEMPERATURE CONTROL DEVICE

(71) Applicant: KELK Ltd., Hiratsuka-shi, Kanagawa (JP)

(72) Inventor: Daisuke Goto, Kanagawa (JP)

(73) Assignee: KELK Ltd., Kanagawa (JP)

( * ) Notice: Subject to any disclaimer, the term of this patent is extended or adjusted under 35 U.S.C. 154(b) by 674 days.

(21) Appl. No.: 14/655,262

(22) PCT Filed: Nov. 7, 2013

(86) PCT No.: PCT/JP2013/080122
§ 371 (c)(1),
(2) Date: Jun. 24, 2015

(87) PCT Pub. No.: WO2014/103525
PCT Pub. Date: Jul. 3, 2014

(65) Prior Publication Data
US 2016/0196960 A1    Jul. 7, 2016

(30) Foreign Application Priority Data

Dec. 25, 2012   (JP) ................................ 2012-281845

(51) Int. Cl.
*H01J 37/32* (2006.01)
*G05D 23/19* (2006.01)

(52) U.S. Cl.
CPC ........ *H01J 37/32724* (2013.01); *G05D 23/19* (2013.01); *H01J 37/32009* (2013.01); *H01J 2237/334* (2013.01)

(58) Field of Classification Search
CPC ............... G05D 23/19; H01J 37/32724; H01J 37/32522; F28D 1/0213; H01L 21/67248
See application file for complete search history.

(56) References Cited

U.S. PATENT DOCUMENTS 4,495,780 A * 1/1985 Kaneko ................... F25B 49/02
                                                          174/15.1
5,974,816 A * 11/1999 Endo ................... G03F 7/70875
                                                          62/179

(Continued)

FOREIGN PATENT DOCUMENTS

CN        101001975        7/2007
CN        101495822        7/2009

(Continued)

OTHER PUBLICATIONS

Office Action dated Jul. 19, 2016 for corresponding Japanese Application No. 2012-281845, 6 pages [with English Translation].

(Continued)

*Primary Examiner* — Charlee J C Bennett
(74) *Attorney, Agent, or Firm* — Fish & Richardson P.C.

(57) ABSTRACT

A temperature control device includes: a circulating cooling/heating unit cooling and heating a circulating fluid and circulating the circulating fluid relative to a chamber; a controller adjusting a temperature of the circulating fluid to adjust the temperature of the chamber to a temperature setpoint, and a housing for housing the circulating cooling/heating unit and the controller, the housing defining therein a circulation chamber in which the circulating cooling/heating unit is disposed and a control chamber in which the controller is disposed. These chambers are on the same level. A reservoir for storing the circulating fluid, a pump for circulating the circulating fluid, a heat exchanger for cooling the circulating fluid, and a heater for heating the circulating fluid are disposed in the circulation chamber. An inverter for controlling a drive of the pump and an SSR for switching ON/OFF of the heater are disposed in the control chamber.

11 Claims, 6 Drawing Sheets

(56) References Cited

U.S. PATENT DOCUMENTS

| | | | | |
|---|---|---|---|---|
| 6,345,515 | B1* | 2/2002 | Pautsch | F28D 5/00 |
| | | | | 257/E23.088 |
| 2002/0015287 | A1* | 2/2002 | Shao | H05K 7/20727 |
| | | | | 361/695 |
| 2003/0173351 | A1* | 9/2003 | Atlas | G05D 23/20 |
| | | | | 219/494 |
| 2004/0068197 | A1 | 4/2004 | Sarel | |
| 2004/0068997 | A1* | 4/2004 | Hirooka | F25B 25/005 |
| | | | | 62/175 |
| 2004/0216475 | A1* | 11/2004 | Sasaki | H01L 21/67167 |
| | | | | 62/185 |
| 2006/0000551 | A1 | 1/2006 | Saldana et al. | |
| 2006/0175051 | A1* | 8/2006 | Kinoshita | G05D 23/1919 |
| | | | | 165/287 |
| 2007/0098527 | A1* | 5/2007 | Hall | H01L 21/67775 |
| | | | | 414/222.01 |
| 2010/0000970 | A1 | 1/2010 | Koshimizu et al. | |
| 2010/0223947 | A1* | 9/2010 | Shibuya | B60H 1/3223 |
| | | | | 62/323.3 |
| 2010/0243609 | A1* | 9/2010 | Yamazawa | H01J 7/32091 |
| | | | | 216/71 |
| 2016/0196954 | A1* | 7/2016 | Goto | H01J 37/32522 |
| | | | | 156/345.18 |

FOREIGN PATENT DOCUMENTS

| | | |
|---|---|---|
| CN | 101625952 | 1/2010 |
| JP | S59-155774 | 10/1984 |
| JP | S61-138276 | 8/1986 |
| JP | H04-060322 A | 9/1992 |
| JP | H10-209125 A | 8/1998 |
| JP | H11-007248 | 1/1999 |
| JP | 2002-168551 A | 6/2002 |
| JP | 2005-188767 | 7/2005 |
| JP | 2006-185258 A | 7/2006 |
| JP | 2008-116199 A | 5/2008 |

OTHER PUBLICATIONS

International Search Report dated Dec. 3, 2013 for corresponding International Application No. PCT/JP2013/080122, 4 pages.
Office Action dated Mar. 14, 2016 for corresponding Korean Application No. 10-2015-7016088, 8 pages [with English Translation].
Office Action dated Apr. 5, 2016 for corresponding Chinese Application No. 201380067966.0, 7 pages [with English Translation].

* cited by examiner

TEMPERATURE CONTROL DEVICE

CROSS-REFERENCE TO RELATED APPLICATIONS

This application claims priority to International Application No. PCT/JP2013/080122 filed on Nov. 7, 2013, which application claims priority to Japanese Application No. 2012-281845, filed on Dec. 25, 2012. The contents of the above applications are incorporated herein by reference in their entireties.

TECHNICAL FIELD

The present invention relates to a temperature control device and, in particular, to a temperature control device provided to plasma-etching equipment.

BACKGROUND ART

Typical semiconductor processing equipment such as plasma-etching equipment is provided with a temperature control device for controlling the temperature of a chamber. The temperature control device circulates and supplies a circulating fluid, a temperature of which is adjusted to a predetermined temperature, to a chamber to adjust the temperature of the chamber to a temperature setpoint. For instance, Patent Literature 1 discloses a temperature control device including: a main frame divided into an upper frame and a lower frame; a power/control unit disposed on the upper frame; and a heat exchanging unit disposed on the lower frame, the heat exchanging unit including a heat exchanger, a pump and the like for a circulating fluid.

CITATION LIST

Patent Literature(s)

Patent Literature 1: JP-A-2006-185258

SUMMARY OF THE INVENTION

Problem(s) to be Solved by the Invention

The temperature control device of Patent Literature 1, however, entails a problem that it is not possible to access a deep inside portion of the heat exchanging unit from side or above for maintenance purpose due to the presence of the power/control unit disposed above the heat exchanging unit. Accordingly, a column of the frame needs to be partly removed to pull the exchanging unit forward prior to maintenance on such a portion, and the column needs to be reassembled after the heat exchanging unit is pushed backward when the maintenance is completed. This makes the maintenance complicated.

Further, an installation space for the temperature control device, which should be disposed near semiconductor processing equipment, needs to be determined in consideration of pulling the heat exchanging unit forward, which results in necessity for an extra increase in the installation space for the temperature control device.

An object of the invention is to provide a temperature control device that is easy in maintenance and installable in a small space.

Means for Solving the Problem(s)

According to a first aspect of the invention, a temperature control device configured to circulate and supply a circulating fluid with a temperature being adjusted to a chamber of plasma-etching equipment to adjust a temperature of the chamber to a temperature setpoint, includes: a circulating cooling/heating unit configured to cool and heat the circulating fluid and to circulate the circulating fluid relative to the chamber; a controller configured to adjust the temperature of the circulating fluid to adjust the temperature of the chamber to the temperature setpoint, and a housing for housing the circulating cooling/heating unit and the controller, the housing defining therein a circulation chamber in which the circulating cooling/heating unit is disposed and a control chamber in which the controller is disposed, the circulation chamber and the control chamber being on a same level, in which the circulating cooling/heating unit includes at least: a reservoir for storing the circulating fluid; a pump for circulating the circulating fluid; a heat exchanger for cooling the circulating fluid; and a heater for heating the circulating fluid, the reservoir, the pump, the heat exchanger and the heater being disposed in the circulation chamber, and the controller includes at least: an inverter for controlling a drive of the pump; and a switch for switching ON/OFF of the heater, the inverter and the switch being disposed in the control chamber.

According to a second aspect of the invention, the housing includes a partitioning panel that divides an inner space of the housing into the circulation chamber and the control chamber, the pump is disposed in the circulation chamber near the partitioning panel, the inverter is disposed in the control chamber and attached to the partitioning panel, and a suction fan for sucking a cooling air into the housing from an outside of the housing and an exhaust fan for discharging the sucked cooling air to the outside of the housing are provided in the circulation chamber, the suction fan being disposed at an end of the partitioning panel in a plan view, the exhaust fan being disposed at an end of the partitioning panel.

According to a third aspect of the invention, the circulation chamber is disposed near the plasma-etching equipment, whereas the controller is disposed remote from the plasma-etching equipment.

According to a fourth aspect of the invention, the housing includes a bottom panel defining a pan corresponding to the circulation chamber.

According to a fifth aspect of the invention, an operation panel is provided on an upper surface of the housing at a position corresponding to the control chamber.

In the temperature control device according to the first aspect of the invention, the circulation chamber and the control chamber of the housing are arranged side by side on the same level. Therefore, for instance, when the housing is removed, the circulating cooling/heating unit disposed in the circulation chamber and the controller disposed in the control chamber can be accessed from above, so that maintenance on components of the temperature control device can be easily done. Further, the temperature control device does not need to be pulled out to a different area unlike a typical device, so that an installation space for the temperature control device does not need to be determined in consideration of such an area, which results in reduction in the installation space.

In the temperature control device according to the second aspect of the invention, a large amount of heat generated by the inverter and radiated into the circulation chamber through the partitioning panel can be immediately released outside the housing with the cooling air sucked using the suction fan and flowing along the partitioning panel, thereby efficiently cooling the inverter and restraining the heat from staying in the circulation chamber. Further, the cooling air flows near the pump, so that a drive unit for the pump (e.g., a motor) can also be cooled well.

In the temperature control device according to the third aspect of the invention, the circulation chamber is disposed near the plasma-etching equipment, so that a pipe connecting the circulation chamber and the chamber of the plasma-etching equipment can be shortened and easily arranged, which results in reduction in an installation space for the pipe. It should be noted that a cable or the like connecting the controller and the plasma-etching equipment is connected to a connector provided to the controller at a side opposite to the circulation chamber.

In the temperature control device according to the fourth aspect of the invention, the pan is disposed at the bottom of the circulation chamber. Therefore, in the case where the circulating fluid or the like leaks into the circulation chamber, the leakage can be received on the pan to prevent the influence of the leakage on the controller in the control chamber.

In the temperature control device according to the fifth aspect of the invention, the operation panel is provided on the upper surface of the housing. Therefore, the temperature control device can be easily operated even when installed directly on, for instance, the floor.

BRIEF DESCRIPTION OF DRAWING(S)

DESCRIPTION OF EMBODIMENT(S)

An exemplary embodiment of the invention will be described below with reference to the attached drawings.

Figure 1:
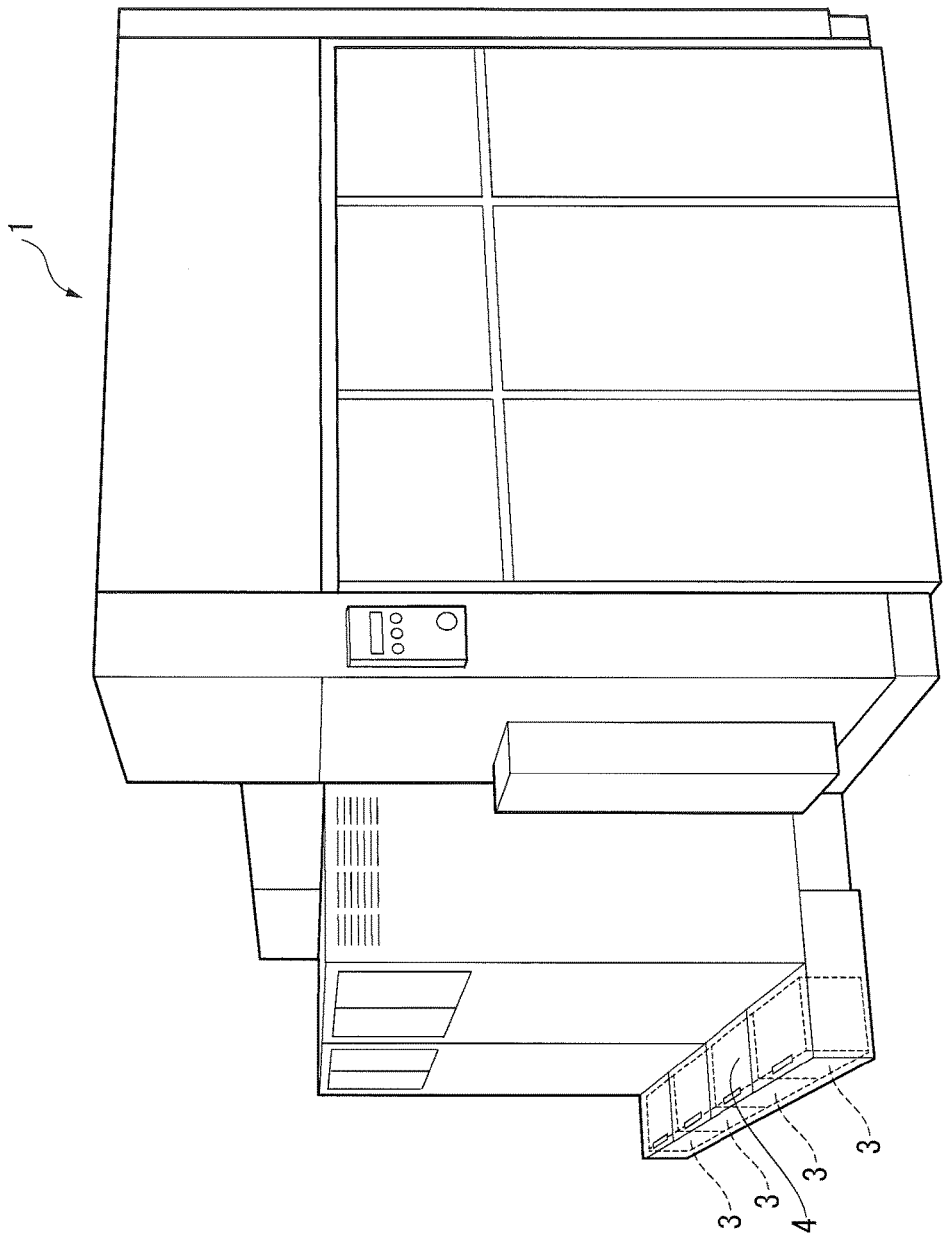
FIG. 1 is a perspective view showing plasma-etching equipment employing a temperature control device according to an exemplary embodiment of the invention.
Figure 2:
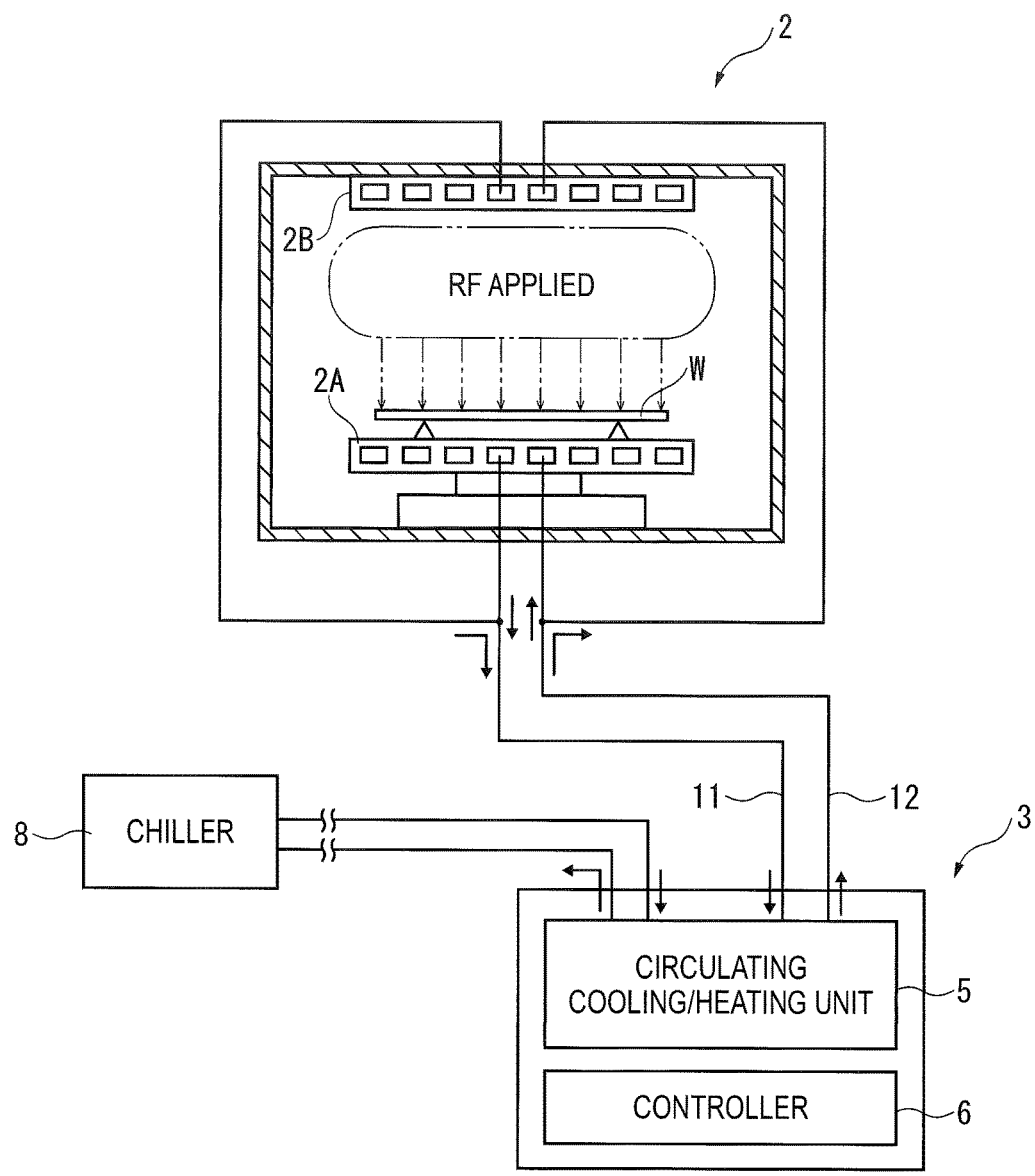
FIG. 2 is a schematic view showing a chamber and a temperature control device in the plasma-etching equipment.

FIG. 1 is a perspective view showing plasma-etching equipment 1 according to the exemplary embodiment. FIG. 2 is a schematic view showing a chamber 2 and a temperature control device 3 in the plasma-etching equipment 1.
General Description of Overall Arrangement of Plasma-etching Equipment As shown in FIGS. 1 and 2, the plasma-etching equipment 1, which is equipment performing a plasma-dry process to etch a semiconductor wafer W, includes therein the chamber 2 including a plurality of chambers (only one of them is shown in FIG. 1). The temperature of each of the chambers 2 is adjusted to a predetermined temperature setpoint using a temperature-adjusted circulating fluid supplied from the temperature control device 3. In the exemplary embodiment, the temperature control device 3 includes a plurality of temperature control devices corresponding to the plurality of chambers 2 and is housed in a step 4 for an operator disposed on a side of the plasma-etching equipment 1.

In performing the etching process, the chambers 2 are vacuumed and maintained at a predetermined low pressure.

An etching gas (a process gas) is introduced into the chambers 2 in the low-pressure state. The introduced etching gas is turned into plasma to etch the semiconductor wafer W. In performing the above process, the respective temperatures of the chambers 2 are adjusted to the temperature setpoint using the circulating fluid from the temperature control devices 3.

Figure 3:
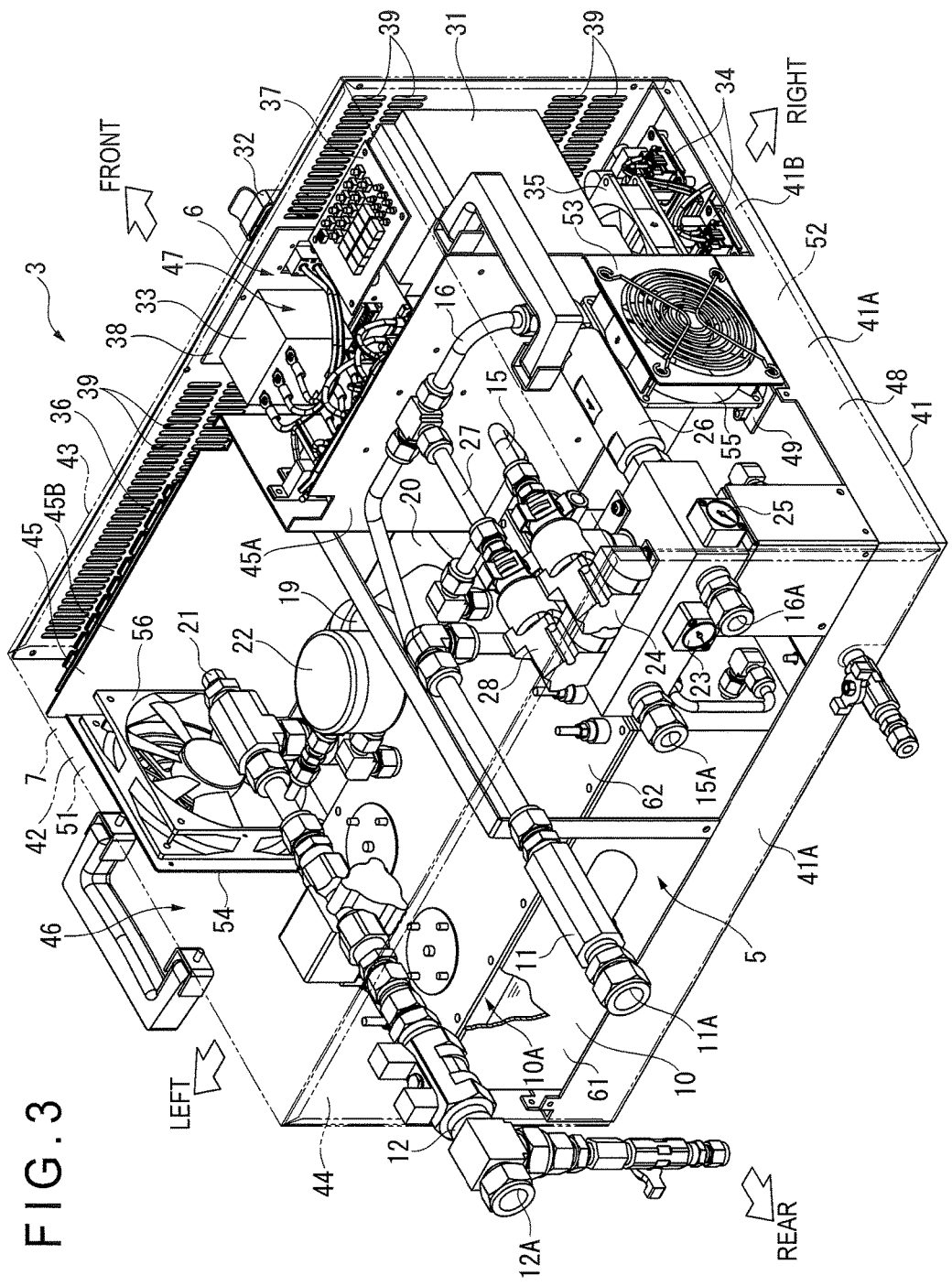
FIG. 3 is a perspective view showing an overall arrangement of the temperature control device.
Figure 4:
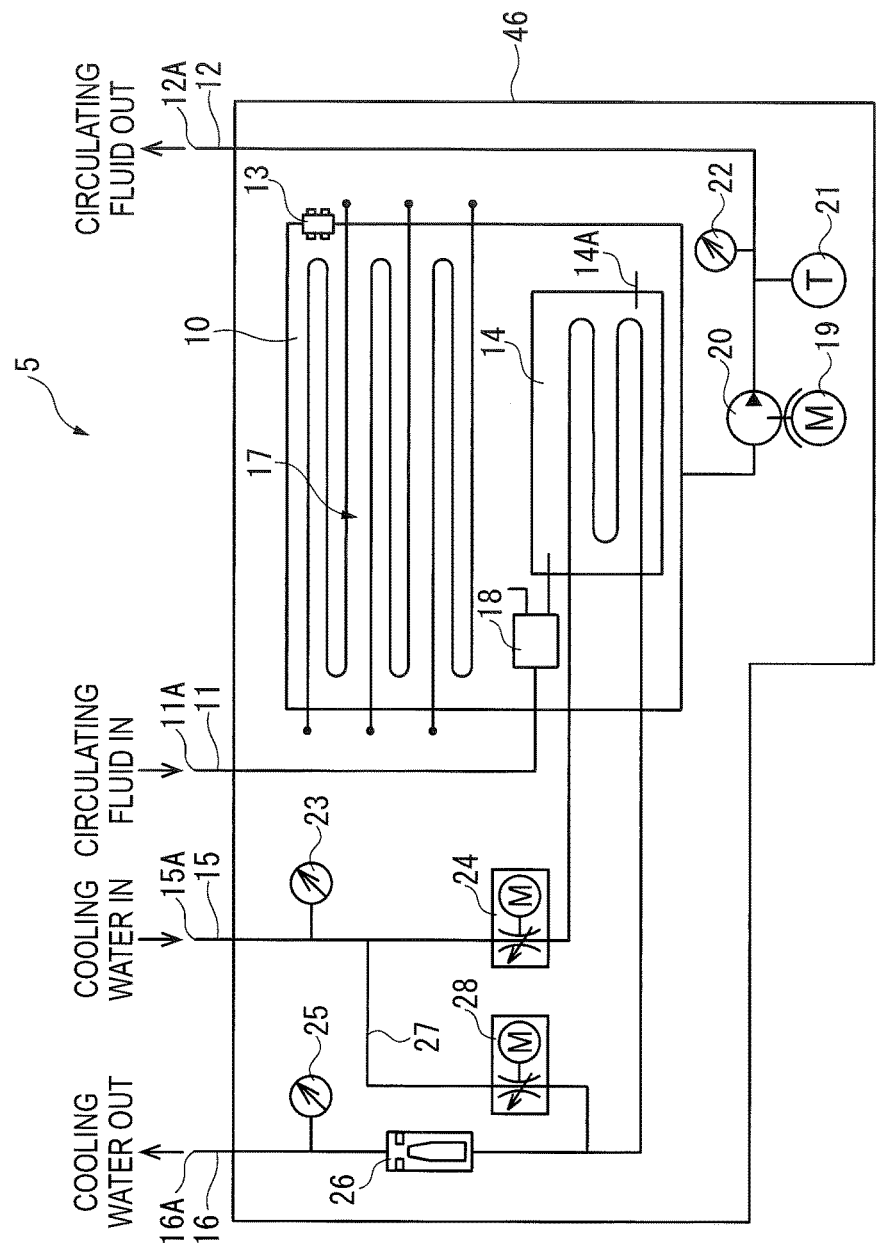
FIG. 4 shows a schematic arrangement and a fluid circuit of the circulating cooling/heating device provided to the temperature control device.

In the exemplary embodiment, the chambers 2 each include a lower electrode 2A on which the semiconductor wafer W is to be mounted, and an upper electrode 2B disposed above the lower electrode 2A, and the circulating fluid flows through an inner path defined in each of the electrodes 2A, 2B to adjust the temperature of each of the chambers 2. In each of the chambers 2, a capacitively coupled plasma is generated by applying an RF (Radio Frequency) electric field between the electrodes 2A, 2B. It should be noted that the chambers 2 may each be configured to generate, for instance, an electron cyclotron resonance plasma, a helicon-wave-excited plasma, an inductively coupled plasma or a microwave-excited surface-wave plasma in place of a capacitively coupled plasma.
Description of Temperature Control Device FIG. 3 is a perspective view showing an overall inner arrangement of each of the temperature control devices 3 as viewed from the rear. FIG. 4 shows a schematic arrangement and a fluid circuit of a circulating cooling/heating unit 5 provided to each of the temperature control devices 3.

As shown in FIGS. 3 and 4, the temperature control devices 3 each include: the circulating cooling/heating unit 5 (a circulating cooling/heating device) that cools and heats the circulating fluid circulated between each of the temperature control devices 3 and the corresponding chamber 2; a controller 6 that controls the temperature of the circulating fluid based on a variety of parameters outputted from the circulating cooling/heating unit 5 to control the temperature of each of the chamber 2 to a temperature setpoint; and a housing 7 for housing the circulating cooling/heating unit 5 and the controller 6.

In each of the temperature control devices 3, the circulating cooling/heating unit 5 and the controller 6, which will be described later in detail, are arranged in a front-and-rear positional relationship on the same level. Therefore, in the case of maintenance on the circulating cooling/heating unit 5 and the controller 6 of one of the temperature control devices 3, a large part of the circulating cooling/heating unit 5 and the controller 6 can be exposed by removing a part of the housing 7 of the one of the temperature control devices 3, so that the maintenance can be easily performed from above. Further, the maintenance can be performed without pulling the one of the temperature control devices 3 from a housing portion defined in the step 4 to a wider area, so that it is not necessary to provide a large installation space in consideration of the necessity of such a wider area.

It should be noted that the circulating cooling/heating unit 5 of each of the temperature control devices 3 in the exemplary embodiment is connected to a chiller 8. The chiller 8 supplies and circulates a cooling water with a constant temperature to the circulating cooling/heating unit 5. The cooling water is used to cool the circulating fluid in the circulating cooling/heating unit 5. The circulating fluid is a fluorine coolant such as GALDEN (a trademark of Ausimont K.K.) and Fluorinert (a trademark of 3M Company).
Description of Circulating Cooling/Heating Unit The circulating cooling/heating unit 5 occupies a rear area defined in each of the temperature control devices 3. When the circulating cooling/heating unit 5 is disposed in the rear area, a pipe for the circulating fluid and a pipe for the cooling water extending rearward from the circulating cooling/heating unit 5 can be arranged under a body of the plasma-etching equipment 1 and connected to the chamber 2 or the chiller 8. The pipes are thus not exposed outside the plasma-etching equipment 1, so that it is not necessary to prepare a space for pipe arrangement in addition to the installation space for the plasma-etching equipment 1.

Further, since the circulating cooling/heating unit 5 is close to the chamber 2 and the like, the pipes may be shortened to reduce the usage of the circulating fluid. As a result, a reservoir 10 storing the circulating fluid and a heat exchanger 14 (both described later) can be reduced in capacity or size, thereby considerably downsizing the circulating cooling/heating unit 5 and, consequently, each of the temperature control devices 3. Each of the temperature control devices 3 can thus be reliably housed in a narrow installation space defined in the step 4.

Specifically, the circulating cooling/heating unit 5 includes the reservoir 10 storing the circulating fluid. The reservoir 10 is connected to an inflow path 11 and an outflow path 12, which respectively include an inflow portion 11A and an outflow portion 12A for the circulating fluid. The reservoir 10 has therein a clearance space above the circulating fluid stored in the reservoir 10. The clearance space, which is unfilled with the circulating fluid, defines an air chamber 10A as shown in a partially cutaway view of the reservoir 10 in FIG. 3.

Volume contraction or volume expansion of the circulating fluid resulting from cooling or heating the circulating fluid is acceptable due to a change in the capacity of the air chamber 10A. A breather 13 is provided on a side of the reservoir 10 to prevent an excessive pressure change resulting from a change in the capacity of the air chamber 10A. The breather 13 admits or releases air into or out of the air chamber 10A in accordance with the pressure of the air chamber 10A to maintain the pressure of the air chamber 10A within a predetermined range.

In the reservoir 10, the heat exchanger 14 is housed and constantly immersed in the circulating fluid. The inflow path 11 for the circulating fluid has an end connected to the heat exchanger 14 in the reservoir 10. The heat exchanger 14 has an outlet 14A for discharging the circulating fluid into the reservoir 10. The heat exchanger 14 performs thermal exchange between the circulating fluid and the cooling water to cool the circulating fluid. The heat exchanger 14 is thus connected to an inflow path 15 and an outflow path 16, which respectively include an inflow portion 15A and an outflow portion 16A for the cooling water.

Since the heat exchanger 14 is immersed in the circulating fluid, the circulating fluid entering the heat exchanger 14 is also cooled from the outside of the heat exchanger 14 by the cooled circulating fluid. Further, since the heat exchanger 14 is housed in the reservoir 10, it is not necessary to provide an installation space for the heat exchanger 14 outside the reservoir 10 even though the size of the reservoir 10 has to be slightly increased. The circulating cooling/heating unit 5 can thus be reliably downsized as a whole even though the size of the reservoir 10 itself is slightly increased.

In the reservoir 10, a heater 17 including three sheathed heaters is also housed. Terminals 17A of the sheathed heaters are exposed on an upside of the reservoir 10, and the sheathed heaters generate heat with an electric power supplied through the terminals 17A. The circulating fluid is heated by the heat generated by the sheathed heaters.

In the reservoir 10, the inflow path 11 for the circulating fluid is provided with a relief valve 18. When the flow of the circulating fluid into the heat exchanger 14 is restricted for any reason and the pressure of the circulating fluid in the heat exchanger 14 exceeds a predetermined level, the relief valve 18 is opened to release the circulating fluid into the reservoir 10.

At the outside of the reservoir 10, the outflow path 12 for the circulating fluid is provided with a pump 20 driven by a motor 19. Further, a temperature sensor 21 and a pressure gauge 22 are provided downstream of the pump 20. When the pump 20 is driven, the circulating fluid is circulated between the circulating cooling/heating unit 5 and the corresponding chamber 2. It should be noted that the outflow path 12 has a base end opened in the reservoir 10 at an appropriate position determined depending on, for instance, actual installation positions of the heat exchanger 14 and the heater 17.

Similarly, at the outside of the reservoir 10, the inflow path 15 for the cooling water is provided with a pressure gauge 23 disposed near the inflow portion 15A and a proportional valve 24 disposed downstream of the pressure gauge 23. The outflow path 16 is provided with a pressure gauge 25 disposed near the outflow portion 16A and a constant flow valve 26 disposed upstream of the pressure gauge 25. A downstream side of the inflow path 15 relative to the proportional valve 24 and a downstream side of the outflow path 16 relative to the constant flow valve 26 are in communication with each other through a bypass 27. The bypass 27 is provided with a proportional valve 28. The opening degree of a diaphragm mechanism of each of the proportional valves 24, 28 can be changed to adjust the flow rate of the cooling water flowing through the heat exchanger 14, thereby adjusting the cooling performance of the heat exchanger. The cooling water is circulated using a pump (not shown) in the chiller 8 (FIG. 2).

The pump 20 for the circulating fluid is disposed between the controller 6 and the reservoir 10 arranged at front and rear sides. The pressure gauge 22 for the circulating fluid is disposed above the reservoir 10. The proportional valves 24, 28, the constant flow valve 26 and the pressure gauges 23, 25 for the cooling water are compactly arranged at a side of the reservoir 10.

Description of Controller

The controller 6 controls, for instance, the drive of the pump 20, the opening degree of each of the proportional valves 24, 28, and ON/OFF of the heater 17 based on a temperature detected by the temperature sensor 21 and other various parameters. The controller 6 occupies a front area in the temperature control device 3 as shown in FIG. 3.

The controller 6 includes: an SSR (Solid State Relay) 30 (FIG. 5) functioning as a switch for switching ON/OFF of the heater 17; and an inverter 31 provided with a driving circuit for the pump 20. The controller 6 further includes, for instance, a power connector 32, connectors for connecting various interface cables, a power switch box 33, a power source board 34, a cooling fan 35 for cooling the inverter 31, a CPU (Central Processing Unit) board 36, and an operation panel 37.

Typically, a heater is provided in each electrode of a chamber, and ON/OFF of the heater is controlled by a temperature control device. This is because, for instance, in view of the fact that heat is absorbed from the circulating fluid in the middle of a long pipe extending from a circulating cooling/heating device, the circulating fluid typically has to be further heated using the heater in each electrode. However, with the above arrangement, the temperature of the circulating fluid can be adjusted up to approximately 90 degrees C. at the highest. Further, the typical temperature control device requires a costly filter for reducing noise generated by the heater in each electrode.

In contrast, in the exemplary embodiment, the pipe for circulation is shortened and the usage of the circulating fluid is reduced, so that even the heater 17 with a relatively small size is sufficient to adjust the temperature of the circulating fluid up to approximately 150 degrees C., as described above. Accordingly, it is not necessary to provide a heater in each of the electrodes 2A, 2B of each of the chambers 2, so that the production cost of temperature control device 3 can be reliably reduced.

Description of Housing

As shown in FIG. 3, the housing 7 includes: a bottom panel 41 on which the circulating cooling/heating unit 5 and the controller 6 are mounted; an upper cover 42 (shown by two-dot chain lines in FIG. 3) covering an upper side and lateral sides of each of the circulating cooling/heating unit 5 and the controller 6; a front cover 43 fixed to the bottom panel 41 and the upper cover 42 to cover a front of the temperature control device 3; a rear cover 44 (shown by two-dot chain lines in FIG. 3) similarly fixed to the bottom panel 41 and the upper cover 42 to cover a rear of the temperature control device 3; and a partitioning panel 45 dividing a space in the temperature control device 3 into front and rear parts. A space behind the partitioning panel 45 is defined as a circulation chamber 46 where the circulating cooling/heating unit 5 is disposed, whereas a space in front of the partitioning panel 45 is defined as a control chamber 47 where the controller 6 is provided. In other words, the chambers 46, 47 are present on the same level.

The bottom panel 41 includes a rise portion 41A formed along a periphery of the bottom panel 41 corresponding to the circulation chamber 46. A height H1 of the rise portion 41A is higher than a height H2 of a rise portion 41B formed along a periphery corresponding to the control chamber 47. Specifically, the bottom panel 41 defines a pan 48 surrounded by the rise portion 41A along a bottom-side periphery thereof corresponding to the circulation chamber 46. A bottom of the pan 48 is provided with a fluid-leakage sensor 49 that detects the circulating fluid.

The circulating fluid and the cooling water flow into and out of the circulation chamber 46. In the case where the circulating fluid and the cooling water leak in the circulation chamber 46, the leakage can be received by the pan 48. As a result, the circulating fluid and the cooling water can be prevented from leaking into the control chamber 47 to affect an electronic component or the like or from leaking outside. Further, when the leakage of the circulating fluid and the cooling water onto the pan 48 is detected by the fluid-leakage sensor 49, the leakage is displayed on the operation panel 37, a display provided to the plasma-etching equipment 1, or the like.

The upper cover 42 has an upper surface 51 and right and left side surfaces 52, 52, and can be upwardly removed using right and left handles after being unfixed from the bottom panel 41, the front cover 43 and the rear cover 44. The operation panel 37 is attached to the upper surface 51 of the upper cover 42 at a position corresponding to the control chamber 47. The upper surface 51 and the side surfaces 52 of the upper cover 42 are provided with openings (not shown) at positions corresponding to the pressure gauges 22, 23 of the circulating cooling/heating unit 5 so that the pressure gauges 22, 23 can be read even when the upper cover 42 is attached.

The front cover 43 is attached with the power connector 32, a signal transmission/reception connector, the power switch box 33 and the like via a plate 38. The front cover 43 is provided with a large number of slits 39 . . . for releasing heat generated by electric or electronic components of the controller 6. The slits 39 are also provided to the side surfaces 52 of the upper cover 42 and the rear cover 44.

The rear cover 44 is provided with a plurality of openings for avoiding interference with the inflow portion 11A and the outflow portion 12A for the circulating fluid and the inflow portion 15A and the outflow portion 16A for the cooling water as well as an opening allowing the pressure gauge 25 on the outflow path 16 to be visible.

The partitioning panel 45, which includes a first planar portion 45A and a second planar portion 45B, is in a shape of a crank in a plan view. The SSR 30, the inverter 31, the power switch box 33, the power source board 34, the cooling fan 35, the operation panel 37 and the like are disposed in a wider installation space defined in the control chamber 47 by the first planar portion 45A. In contrast, in a narrower installation space defined in the control chamber 47 by the second planar portion 45B, a CPU board 36 and the like are disposed.

In the circulation chamber 46, a narrower installation space is defined behind the wider installation space of the control chamber 47 by the first planar portion 45A, and the proportional valves 24, 28, the constant flow valve 26, the pressure gauges 23, 25 for the cooling water, and the like are disposed in the narrower installation space. In contrast, in the circulation chamber 46, a wider installation space is defined behind the narrower installation space of the control chamber 47 by the second planar portion 45B, and the reservoir 10, the pump 20, the temperature sensor 21, the pressure gauge 22 and the like are disposed in the wider installation space.

Right and left sides of the partitioning panel 45 are respectively integral with rectangular attachment pieces 53, 54 bent relative to the first and second planar portions 45A, 45B. A suction fan 55 is attached to the attachment piece 53 and disposed in the narrower installation space of the circulation chamber 46. A exhaust fan 56 is attached to the attachment piece 54 and disposed in the wider installation space of the circulation chamber 46. The side surfaces 52 of the upper cover 42 are provided with openings through which cooling air flows in and out at positions corresponding to the fans 55, 56.

Description of Flow of Cooling Air in Circulation Chamber

Figure 5:
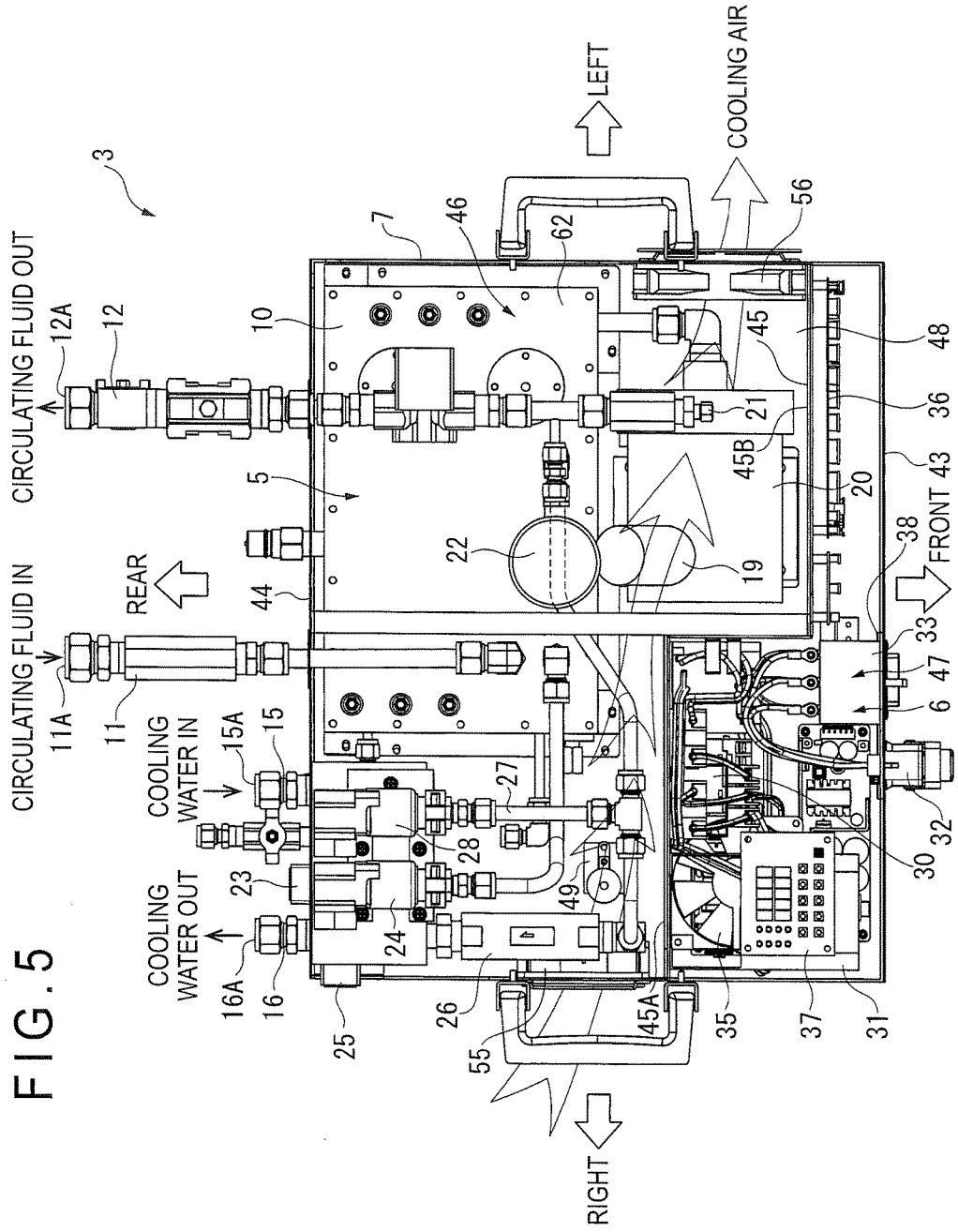
FIG. 5 is a plan view showing an interior of the temperature control device.

FIG. 5 is a plan view showing an interior of the temperature control device 3. In FIG. 5, a flow of the cooling air through the circulation chamber 46 is shown by inserted arrows.

As shown in FIG. 5, the cooling air sucked from the outside of the temperature control device 3 through the suction fan 55 provided at the right side of the temperature control device 3 first flows left along a rear surface of the first planar portion 45A of the partitioning panel 45. Heat-generating components such as the SSR 30 and the inverter 31 are attached on a front surface of the first planar portion 45A, and thus the rear surface of the first planar portion 45A functions as a heat-radiating surface that radiates generated heat. Therefore, when the cooling air flows along the rear surface, heat radiated through the first planar portion 45A can be immediately released outside the housing 7 so as not to stay in the circulation chamber 46.

The cooling air then enters the wider installation space of the circulation chamber 46, and flows between the second planar portion 45B and the reservoir 10. As a result, the motor 19 and the pump 20 driven by the motor 19 are cooled by the cooling air. The cooling air is then discharged outside the temperature control device 3 through the exhaust fan 56 provided at the left side of the temperature control device 3.

Detailed Description of Reservoir

Figure 6:
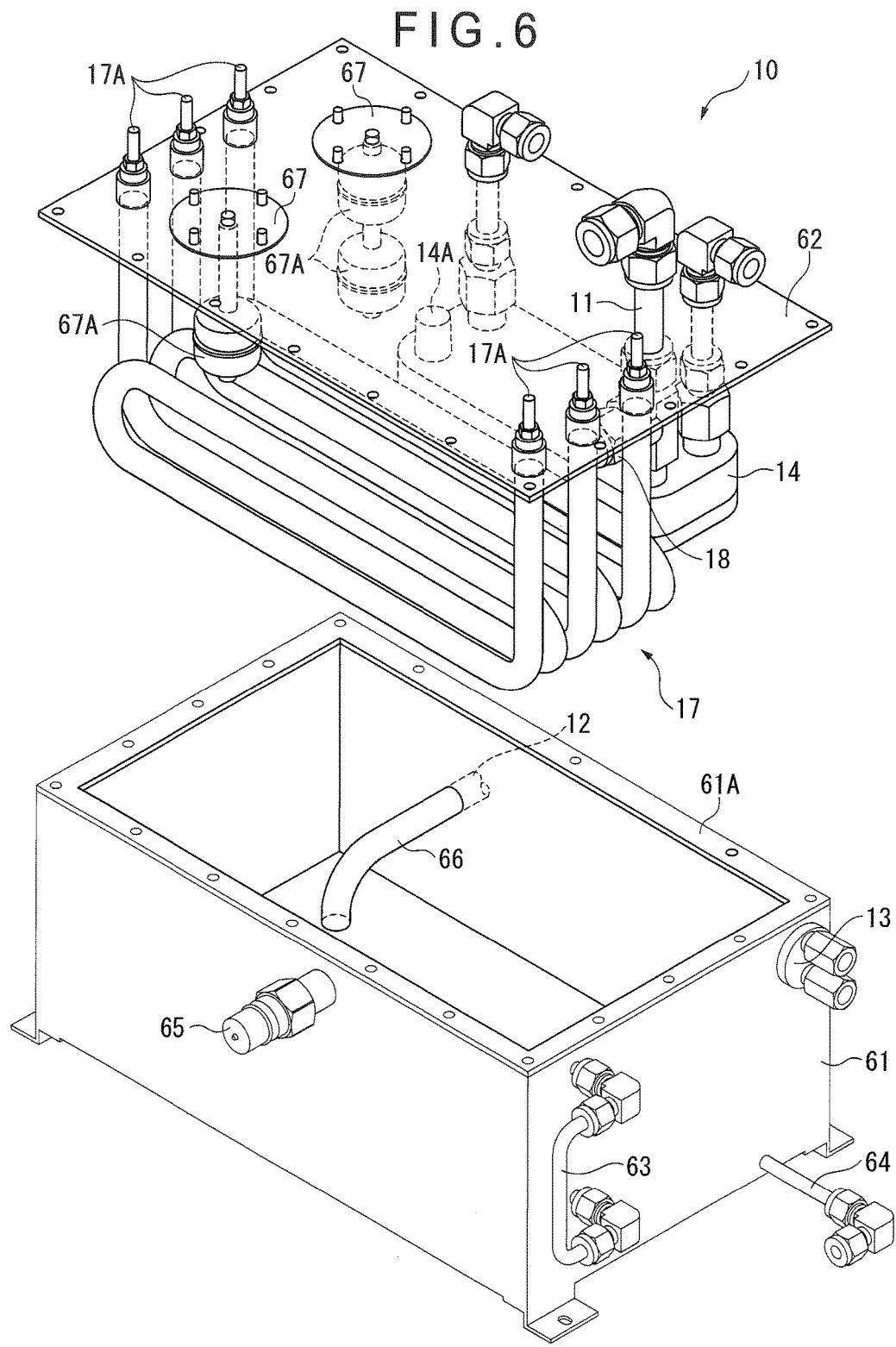
FIG. 6 is an exploded perspective view showing a fluid reservoir of the circulating cooling/heating device.

FIG. 6 is an exploded perspective view showing the reservoir 10. The reservoir 10 will be described below in detail with reference to FIG. 6.

As shown in FIG. 6, the reservoir 10 includes: a reservoir body 61 in the shape of a bottomed box; and a plate-shaped lid body 62 covering an upside of the reservoir body 61. The upside of the reservoir body 61 is provided with an inner flange 61A formed in conformity with a periphery of the reservoir body 61. The lid body 62 is fixed to the inner flange 61A with an appropriate fastener such as a screw. A seal material is interposed between the inner flange 61A and a lower surface of the lid body 62 as needed.

A side surface of the reservoir body 61 is provided with not only the breather 13 but also a leveler 63 for showing an amount of the circulating fluid stored in the reservoir 10 and a drain pipe 64 for discharging the circulating fluid. A rear surface of the reservoir body 61 is provided with a refill port 65 for refilling the reservoir 10 with the circulating fluid. The inside of a front surface of the reservoir body 61 is provided with a suction tube 66, which is the base end of the outflow path 12. The circulating fluid in the reservoir 10 is sucked out through the suction tube 66 by the pump 20.

The heat exchanger 14 and the heater 17 are attached to the lid body 62 and hang from the lower surface of the lid body. A pair of fluid level sensors 67, 67 are attached to the lid body 62 in the same manner as the heat exchanger 14 and the heater 17. The fluid level sensors 67 each include a float 67A floating on the circulating fluid. Based on the position of the float 67A outputted from each of the fluid level sensors 67, it can be detected whether or not the fluid level of the circulating fluid (a stored amount) reaches a lower limit or an upper limit. When the stored amount of the circulating fluid falls below either the lower limit or exceeds the upper limit, the operation panel 37 or the like shows that the stored level falls below the lower limit or exceeds the upper limit.

The heat exchanger 14 and the heater 17 are attached to the lid body 62 of the reservoir 10. Therefore, the heat exchanger 14 and the heater 17 are taken out along with the lid body 62 by unfixing the lid body 62 from the reservoir body 61 and separating the inflow paths 11, 15 and the outflow paths 12, 15 from joints so that maintenance on the heat exchanger 14 and the heater 17 can be easily performed in an offline process. Further, the lid body 62 is removed along with the heat exchanger 14 and the heater 17 and thus the upside of the reservoir body 61 is widely opened, so that maintenance on an interior of the reservoir body 61 can also be easily performed.

Incidentally, it should be understood that the scope of the invention is not limited to the above-described exemplary embodiment(s) but includes modifications and improvements compatible with the invention.

For instance, the temperature control device 3 is disposed so that the circulation chamber 46 is positioned near the plasma-etching equipment 1, whereas the control chamber 47 is remote from plasma-etching equipment 1 in the exemplary embodiment. However, the temperature control device 3 may alternatively be disposed with the circulation chamber 46 and the control chamber 47 each being placed along a side of the plasma-etching equipment 1. In the alternative case, for instance, the pipes from the circulating cooling/heating unit 5 and the cables from the controller 6 may be arranged to extend in an appropriate direction in accordance with the positions of the chambers 46, 47.

The circulation chamber 46 and the control chamber 47 are separated by the partitioning panel 45 in the exemplary embodiment, but may be separated without using the partitioning panel 45 within the scope of the invention. For instance, an area on and above the pan 38 may be defined as the circulation chamber 46, whereas the remaining area may be defined as the controller 47.

The invention claimed is:

1. A temperature control device configured to circulate and supply a circulating fluid with a temperature being adjusted to a chamber of plasma-etching equipment to adjust a temperature of the chamber to a temperature setpoint, the temperature control device comprising:
    a circulating cooling/heating unit configured to cool and heat the circulating fluid and to circulate the circulating fluid relative to the chamber;
    a controller configured to adjust the temperature of the circulating fluid to adjust the temperature of the chamber to the temperature setpoint, and
    a housing for housing the circulating cooling/heating unit and the controller, the housing defining therein a circulation chamber in which the circulating cooling/heating unit is disposed and a control chamber in which the controller is disposed, wherein
    the circulating cooling/heating unit comprises at least: a reservoir for storing the circulating fluid; a pump for circulating the circulating fluid; a heat exchanger for cooling the circulating fluid; and a heater for heating the circulating fluid, the reservoir, the pump, the heat exchanger and the heater being disposed in the circulation chamber,
    the controller comprises at least: an inverter for controlling a drive of the pump; and a switch for switching ON/OFF of the heater, the inverter and the switch being disposed in the control chamber,
    the housing comprises a partitioning panel that horizontally divides an inner width of the housing into the circulation chamber and the control chamber,
    a first opening for sucking a cooling air into the housing from an outside of the housing is provided to the circulation chamber near a first end of the partitioning panel in a plan view,
    the inverter is disposed in the control chamber and attached to the partitioning panel near the first end of the partitioning panel in the plan view,
    a second opening for discharging the sucked cooling air to the outside of the housing is provided to the circulation chamber near a second end of the partitioning panel in the plan view,
    a fan is disposed at a position corresponding to at least one of the first opening and the second opening,
    the pump is disposed in the circulation chamber near the partitioning panel and interposed between the first opening and the second opening at a position closer to the second opening than to the first opening in the plan view,
    the circulation chamber is disposed at a first side of the partitioning panel that faces the plasma-etching equipment, and
    the control chamber is disposed at a second side of the partitioning panel opposite the first side.

2. The temperature control device according to claim 1, wherein the circulation chamber is disposed closer to the plasma-etching equipment than the control chamber.

3. The temperature control device according to claim 1, wherein the housing comprises a bottom panel defining a pan corresponding to the circulation chamber.

4. The temperature control device according to claim 1, wherein an operation panel is provided on an upper surface of the housing at a position corresponding to the control chamber.

5. The temperature control device according to claim 1, wherein the partitioning panel includes a first planar portion and a second planar portion, the partitioning panel having a crank shape in the plan view.

6. The temperature control device according to claim 5, wherein the inverter is attached to the second side of the partitioning panel at the first planar portion, the first side of the partitioning panel corresponding to the inverter being configured to radiate heat generated by the inverter.

7. The temperature control device according to claim 5, wherein the circulation chamber includes a first installation space defined by the first planar portion and a second installation space defined by the second planar portion, the second installation space being wider in width than the first installation space, and wherein the control chamber includes a third installation space defined by the first planar portion and a fourth installation space defined by the second planar portion, the third installation space being wider in width than the fourth installation space.

8. The temperature control device according to claim 7, wherein the first installation space and the third installation space are positioned on opposite sides of the first planar portion of the partitioning panel, and wherein the second installation space and the fourth installation space are positioned on opposite sides of the second planar portion of the partitioning panel.

9. The temperature control device according to claim 7, wherein the reservoir and the pump are disposed in the second installation space, and the inverter and the switch are disposed in the third installation space.

10. The temperature control device according to claim 1, wherein the housing includes:
    a bottom panel on which the circulating cooling/heating unit and the controller are mounted; and
    an upper cover that is coupled to the bottom panel and is configured to cover an upper side of the circulating cooling/heating unit and the controller, the upper cover being configured to be removed from the bottom panel to thereby expose the upper side of the circulating cooling/heating unit and the controller.

11. The temperature control device according to claim 1, wherein the housing covers an upper side of the circulating cooling/heating unit and the controller.

\* \* \* \* \*